United States Patent
Zomorrodi et al.

[11] Patent Number: 6,107,179
[45] Date of Patent: Aug. 22, 2000

[54] INTEGRATED FLEXIBLE INTERCONNECTION

[75] Inventors: Mehrdad Zomorrodi, West Hills, Calif.; Mohammad M. Mojarradi, Pullman, Wash.; Kaiser H. Wong, Torrance, Calif.

[73] Assignee: Xerox Corporation, Stamford, Conn.

[21] Appl. No.: 09/085,763

[22] Filed: May 28, 1998

[51] Int. Cl.[7] .................................................. H01L 21/44
[52] U.S. Cl. ........................ 438/612; 438/613; 438/614; 438/615; 438/108; 438/118; 438/459
[58] Field of Search .................................. 438/612, 613, 438/614, 615, 108, 118, 611, FOR 485, 459

[56] References Cited

U.S. PATENT DOCUMENTS

| | | | |
|---|---|---|---|
| 3,747,202 | 7/1973 | Jordan | 438/125 |
| 3,805,376 | 4/1974 | D'Asaro et al. | 438/38 |
| 3,925,880 | 12/1975 | Rosvold | 438/461 |
| 3,947,952 | 4/1976 | Miller et al. | 438/113 |
| 3,997,963 | 12/1976 | Riseman | 438/461 |
| 4,783,695 | 11/1988 | Eichelberger et al. | 357/65 |
| 5,452,182 | 9/1995 | Eichelberger et al. | 361/749 |

*Primary Examiner*—Andrew Tran
*Assistant Examiner*—Christian D. Wilson
*Attorney, Agent, or Firm*—Fariba Rad

[57] ABSTRACT

A method of creating a plurality of fine pitch integrated interconnects utilizes a flexible layer to create a plurality of integrated interconnects which extend beyond the boundary of the integrated circuit chip onto the substrate. Subsequently, a support layer is deposited on the interconnects and the substrate under the plurality of interconnects which is located beyond the boundary of the integrated circuit chip is removed.

12 Claims, 10 Drawing Sheets

FIG. 5
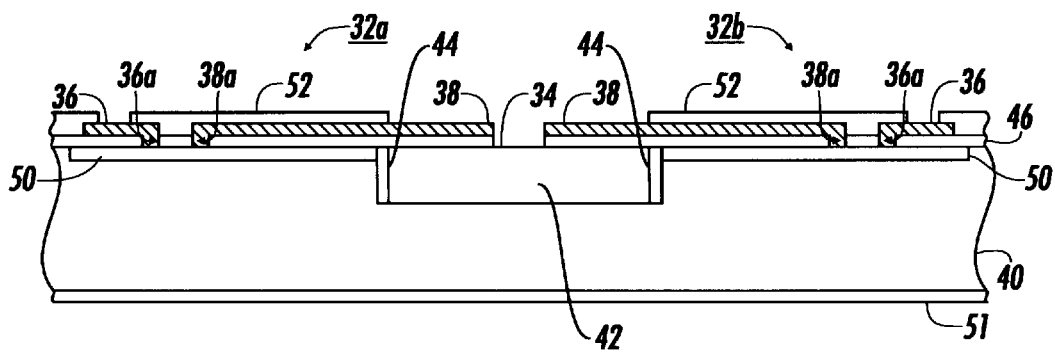
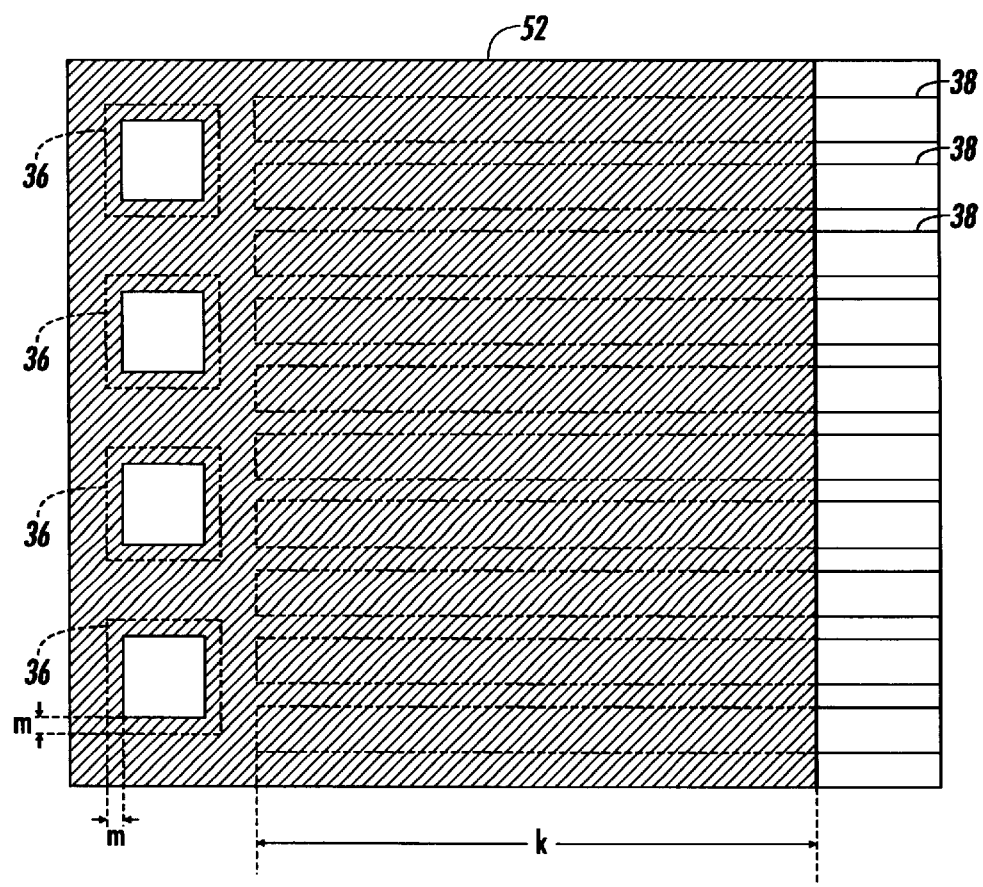
FIG. 6

FIG. 15
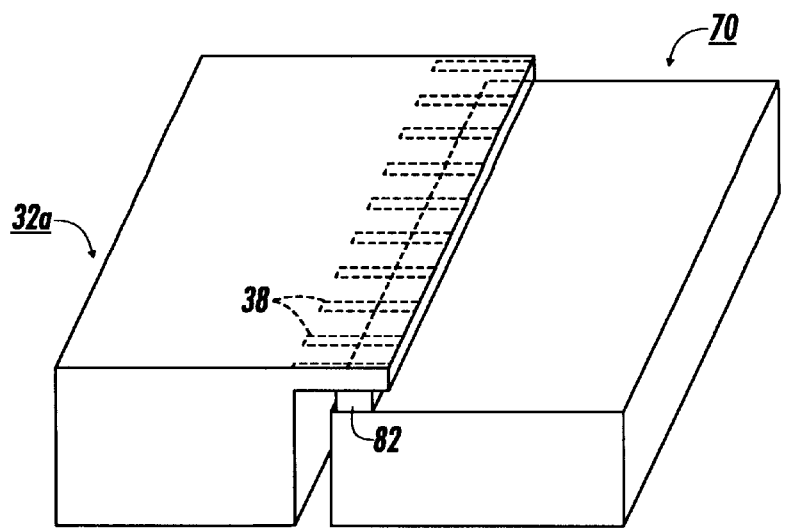
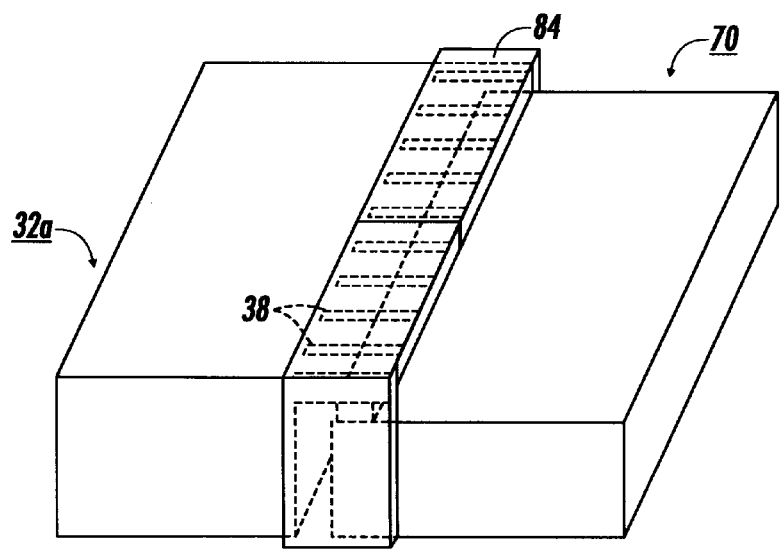
FIG. 16

INTEGRATED FLEXIBLE INTERCONNECTION

INCORPORATION BY REFERENCE

The following U.S. Patent Application are incorporated by reference: U.S. patent application Ser. No. 09/085,847, now abandoned "Fine Flip Chip Interconnection" and U.S. patent application Ser. No. 09/085,867, issued Jul. 13, 1999 as U.S. Pat. No. 5,923,955, "Fine Flip Chip Interconnection" both filed concurrently herewith.

BACKGROUND OF THE INVENTION

This application is related to U.S. patent application Ser. No. 09/085,039, pending "Integrated Flexible Interconnection" Attorney docket No. D/98249 (Common Assignee) filed concurrently herewith.

This Application is related to interconnection of integrated circuit chips and more particularly to fabrication of integrated flexible interconnects with a pitch less than 15 microns.

Due to the increasing demand for additional capacity or function on integrated circuit chips, the number of bonding pads and as a result, the number of interconnects of each chip needs to be increased. However, there is limited space at the edges of each chip. Therefore, in order to increase the number of the bonding pads, the pitch between the bonding pads needs to be decreased.

Conventional interconnection technologies such as wire bonding and tape automated bonding (TAB) are only capable of connecting bonding pads of pitch of 75 micron or above. The finest achievable pitch for Anisotropic conductive Film (AFC) is about 50 to 75 micron. Traditionally, flip chip technology is able to connect 5 micron bonding pads with a 25 micron pitch and a 7 micron bump height. Bump height is referred to the height of the solder bump (interconnect) on each bonding pad. Typically, the solder bumps are created by electroplating, electroless plating, or dip soldering. However, neither approach is capable of producing bump pitch less than 25 microns.

Referring to FIG. 1, there is shown a conventional tape 10 used in TAB process. Tape 10 which is made of polymer or polyimide has a plurality of patterned interconnects 12 which are typically made of copper with a layer of solder over the copper. Usually, a TAB process involves bonding the bonding pads of integrated circuit chips to patterned interconnects. Referring to FIG. 2, there is shown a tape 14 being placed over integrated circuit chips 16. Each one of the interconnects 18 is bonded to a bonding pad (not shown) on each chip 16 in the area shown as 20. The interconnects 18 in the area 20 are called inner leads and the bonding in the area 20 is called Inner Lead Bonding (ILB).

As can be observed, outside of the boundaries of each chip, the interconnects 18 fan out to facilitate the connection of the chip to the external circuitry. This is due to the fact that the external circuitry requires more space for connection. The interconnects 18 in the area 22 are called outer leads and the bonding in these areas are called Outer Lead Bonding (OLB).

In FIG. 2, once the inner leads 18 are bonded to the chips 16, the tape 14 will be cut along the lines 24. Therefore, each chip has bonded interconnects 18 which are flexible and extend beyond the boundaries of the chip. The fan out of the bonded interconnects 18 for the OLB requires a large area, which is not desirable for integrated circuits.

It is an object of this invention to fabricate an integrated circuit with integrated flexible interconnects with a pitch less than 15 microns.

It is also another object of this invention to eliminate the fan out of the interconnects to reduce surface area of the chip.

SUMMARY OF THE INVENTION

In accordance with the present invention, there is disclosed a process of creating a plurality of flexible integrated interconnects for an integrated circuit. On an integrated circuit, creating a plurality of integrated interconnects to extend beyond the boundary of the integrated circuit onto the substrate. Removing the substrate under the plurality of integrated interconnects only in the area beyond the boundary of the integrated circuit to allow the plurality of interconnects to be flexible.

BRIEF DESCRIPTION OF THE DRAWINGS

FIG. 5 shows a magnified sectional view of the wafer of FIG. 3 along the cutting plane 5—5;

FIGS. 6–13 show different steps of processing the flexible interconnects of this invention;

FIG. 15 shows how the flexible bonding pads of FIG. 13 are connected to the matching chip of FIG. 14;

FIG. 16 shows a clip over the bonding pads of the two chips of FIG. 14 which provides pressure to create electrical connection between the bonding pads of the two chips.

DESCRIPTION OF THE PREFERRED EMBODIMENT

Figure 1:
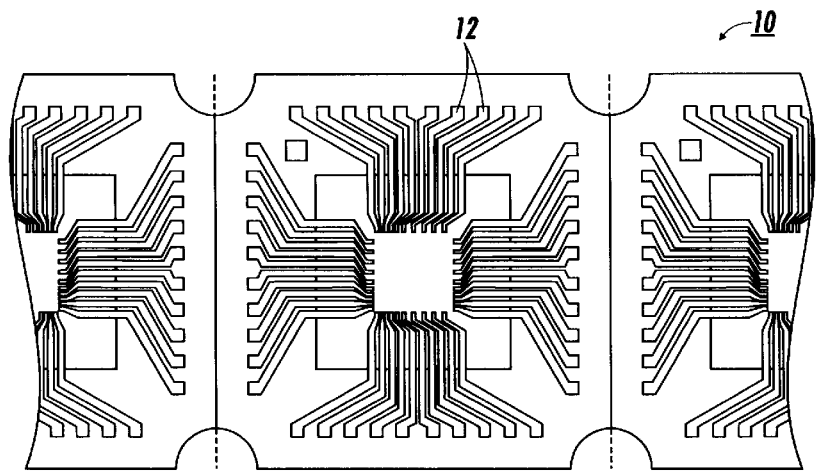
FIG. 1 shows a conventional tape used in TAB process.
Figure 2:
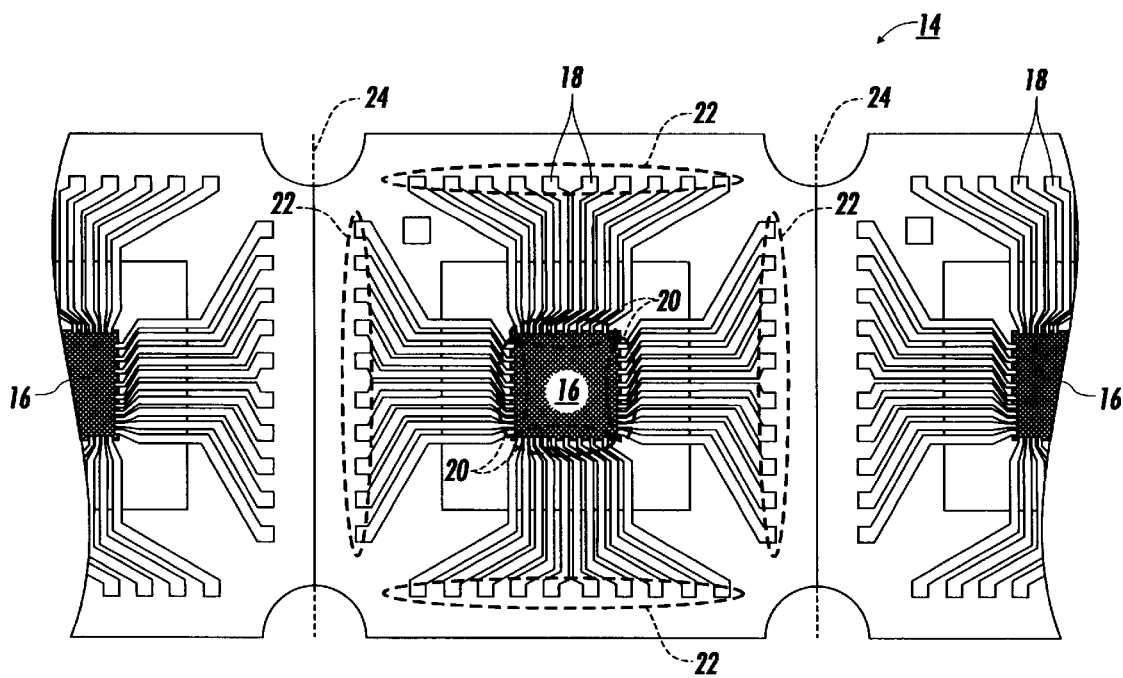
FIG. 2 shows a conventional tape being bonded to an integrated circuit chip.
Figure 3:
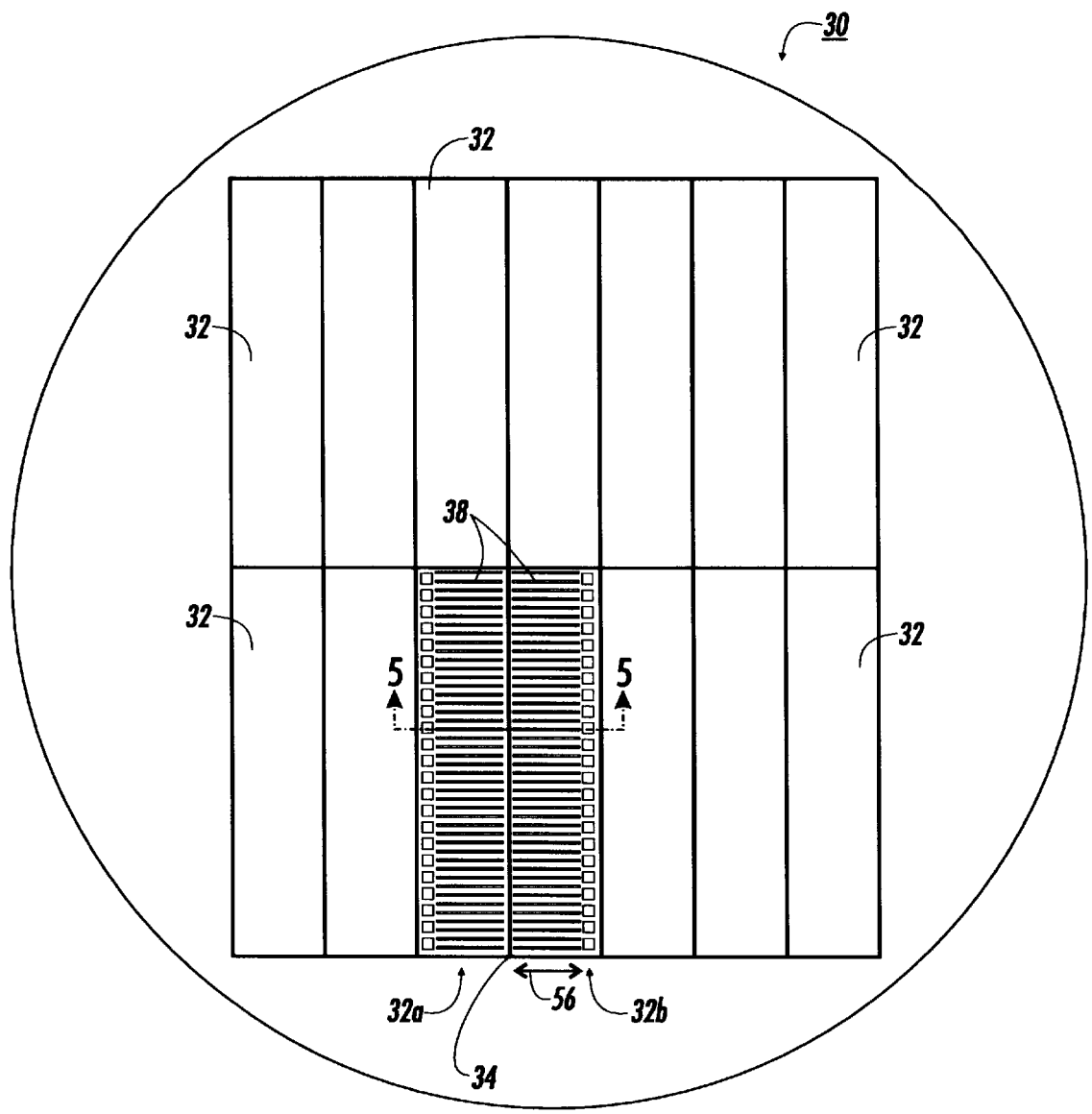
FIG. 3 shows a top view of a wafer, which contains a plurality of integrated circuit chips of this invention.

Referring to FIG. 3, there is shown a top view of a wafer 30, which contains a plurality of integrated circuit chips 32 of this invention. Chips 32 are fabricated in a pair format in which the two chips 32a and 32b of each pair are fabricated in a mirror position of each other along a dividing line 34. In FIG. 3, for the purpose of simplicity, only the details of one pair of chips 32a and 32b are shown.

Figure 4:
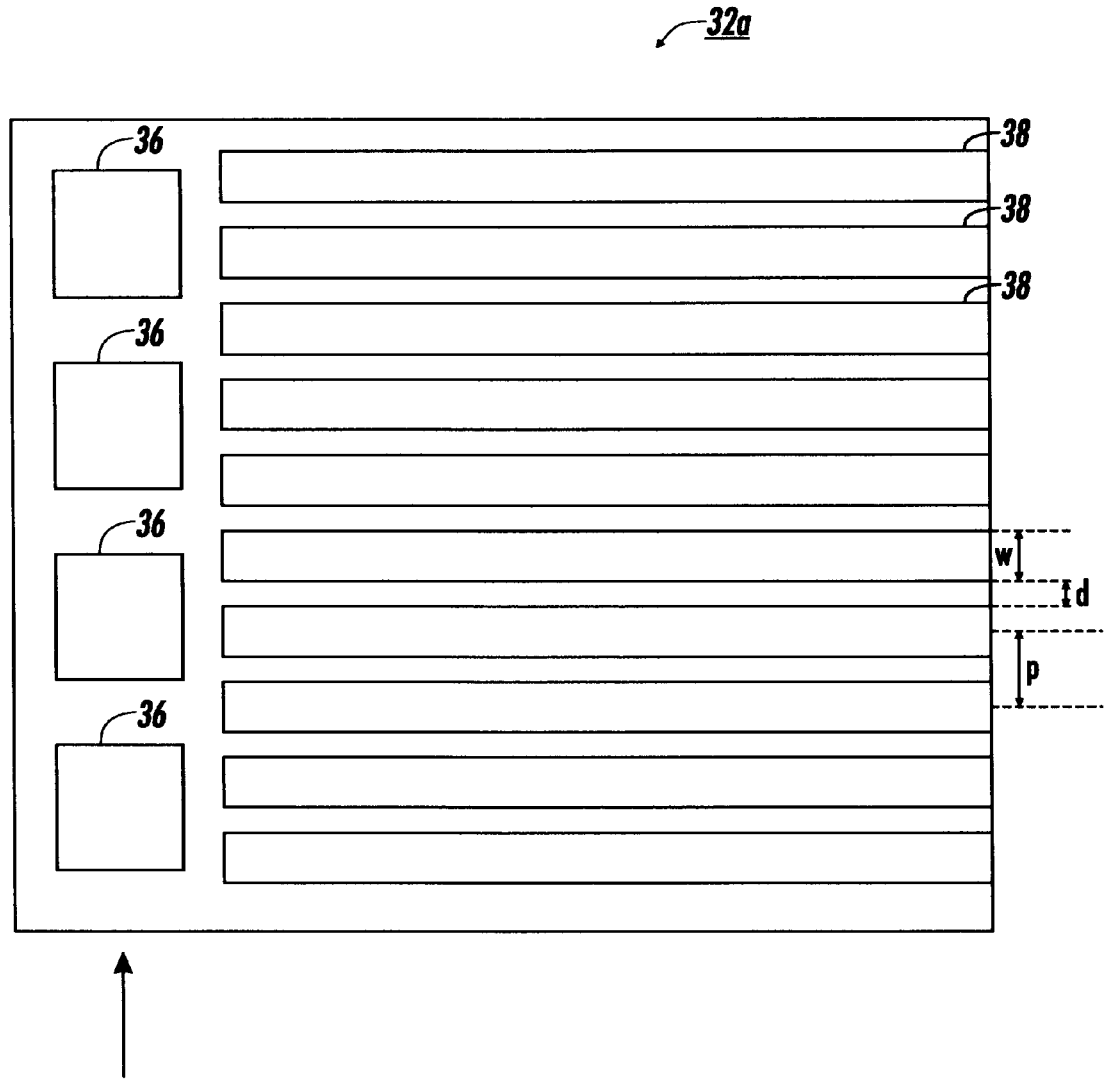
FIG. 4 shows a magnified view of integrated circuit chip 32a of FIG. 3.

Referring to FIG. 4, there is shown a magnified view of a portion of chip 32a of FIG. 3. Each chip 32 has a plurality of large bonding pads 36 such as 75×75 microns, which can be fabricated by any conventional methods. Also, each chip 32 has a plurality of fine pitch interconnects 38. In this invention, the conventional bonding pads and the interconnects are combined together as the interconnects 38. Only a portion of each interconnects 38 is called bonding pad 38, which will be shown and defined in the description of the following Figures.

The interconnects 38 have a 4-micron width w, a 2-micron distance "d" between two adjacent interconnects and a 6 micron pitch "p" (distance between the centerlines of adjacent interconnects). Referring back to FIG. 3, as can be observed, the fine pitch interconnects 38 of each chip 32a and 32b are placed along the dividing line 34.

It should be noted that, the chips 32a and 32b are shown with both large bonding pads 36 and fine pitch interconnects (bonding pads) 38 to show the possibility of having different size bonding pads on the same chip. However, if one desires, the large bonding pads 36 can be eliminated and the chip can be fabricated with only the fine pitch interconnects 38. Also, it should be noted that, for the purpose of simplicity, FIG. 3 shows only the placement of the bonding pads 36 and interconnects 38. Following Figures show the additional layers which will be placed over the bonding pads 36 and interconnects 38.

Referring to FIG. 5, there is shown a magnified sectional view of the wafer 30 of FIG. 3 along the cutting plane 5—5. Chips 32a and 32b are built on a semiconductor substrate 40. The p-type substrate 40 has a n-type doped region 42 which is located under the dividing line 34 and extends equally on the opposite directions from the dividing line 34. Also, the p-type substrate 40 has a 10–20 micron wide heavily p-type doped region 44 around the region 42. Since FIG. 5 is a cross sectional view, dividing line 34 is shown along its width. A layer 46 of silicon oxide, with a thickness of about 1–2 micron, is placed over the substrate 40 in such a manner that it does not cover the dividing line 34. It should be noted that any layer discussed hereinafter, does not cover the dividing line 34 unless mentioned otherwise.

The bonding pads 36 and the interconnects 38 which are fabricated from aluminum are deposited on the silicon oxide layer 46. The interconnects 38 and bonding pads 36 extend through the silicon oxide layer 46 in some areas such as 38a and 36a to contact the chip circuit 50.

A layer 51 of silicon oxide is placed on the bottom surface of the substrate 40 to protect the substrate from a following etching step. A layer 52 of silicon oxide is placed over the top surface of the chips 32a and 32b only partially exposing the interconnects 38 and the bonding pads 36. Referring to FIG. 6, there is shown a top view of chip 32a of FIG. 5. Referring to both FIGS. 5 and 6, the silicon oxide layer 52 covers a portion m such as 2 to 3 microns from each edge of the bonding pads 36. However, it covers a larger portion k of the interconnects 38 and stops at a line which is above the boundary of n-type doped region 42. The silicon oxide layer 52, which is used as a passivation layer, provides insulation between the interconnects 38 and the bonding pads 36.

It should be noted that the silicon oxide layer 52 is the well-known passivation layer used in the fabrication of conventional integrated circuits. However, the silicon oxide layer 46 is a layer which is specifically designed for this invention to protect the interconnects 38 from a following etching step used to etch the substrate 40.

It should also be noted that the two layers 52 and 46 can be made of silicon oxide or silicon nitride.

Figure 7:
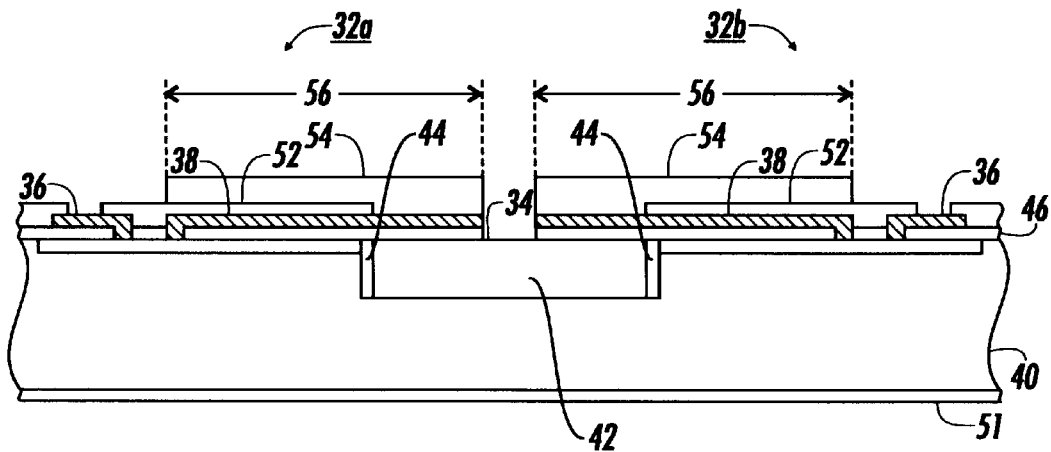
Figure 8:
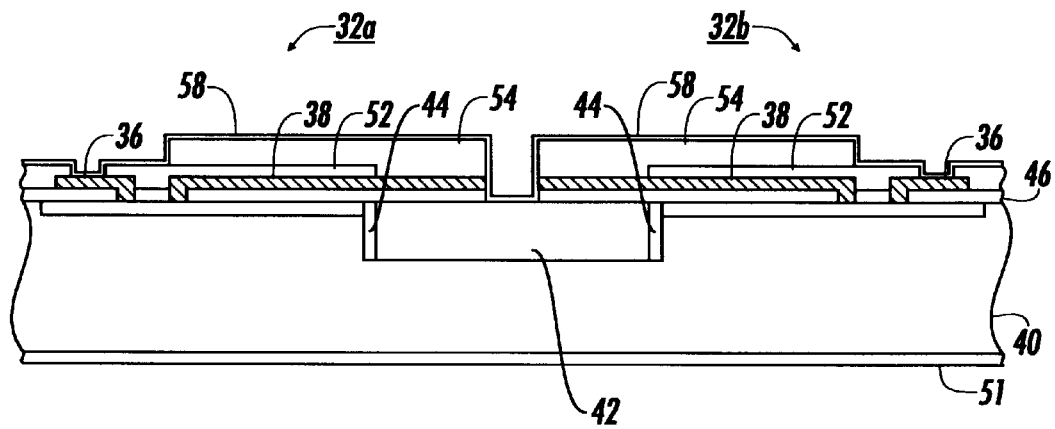

Referring to both FIGS. 7 and 3, about 50 micron thick layer 54 of a negatively photoimagable polyimide is spin coated over the top surface of wafer 30 of FIG. 3 and is patterned by conventional lithographic methods to cover only the region 56 which holds the interconnects 38. Next, referring to FIG. 8, a 2 to 3 micron thick layer 58 of titanium-tungsten is placed over the top surface of wafer 30. Titanium-tungsten protects the polyimide layer 54 from the following process steps. To simplify the process, layer 58 also covers the dividing line 34.

Figure 9:
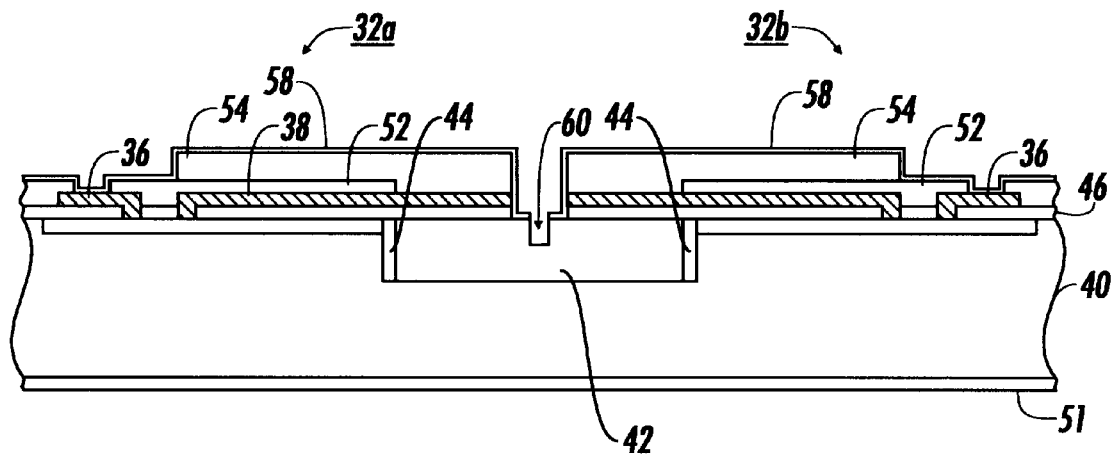
Figure 10:
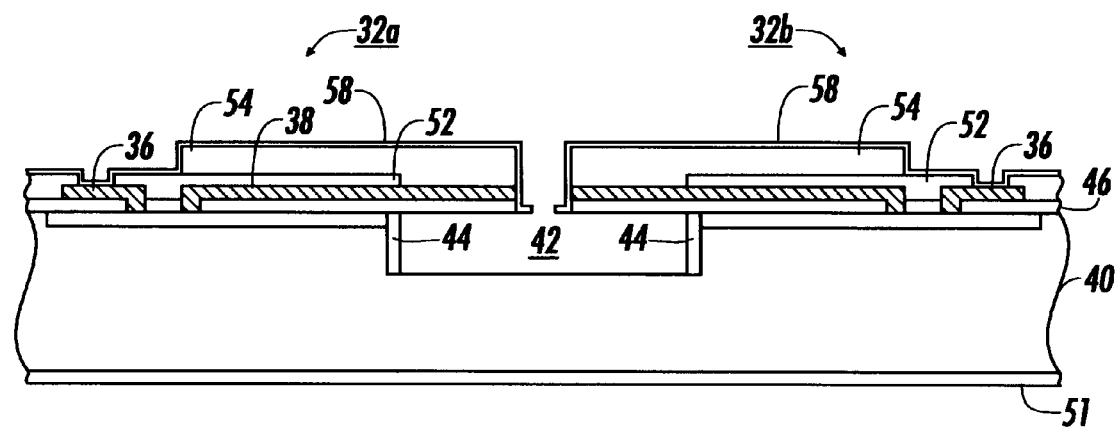

At this stage, referring to FIG. 9, a shallow cut 60 is required into the substrate 40 along the dividing line 34 of FIG. 3. To accomplish this step, a dicing saw can be used. The cut 60 creates an entrance into the substrate 40. Then, the wafer will be placed in an etchant of tetra methyl ammonium hydroxide (TMAH) or ethylene diamine pyro-catechol (CEDP). Through the cut 60, the etchant etches the n-type doped region 42 of the substrate 40 and stops at the boundary of the heavily p-type doped region 44, as shown in FIG. 10. Next, referring to FIG. 11, the wafer will be turned upside down and the area 62 directly under the etched area will be cut out by a dicing saw. The reason the substrate 40 is not etched through the area 62 is that etching is time consuming.

Figure 11:
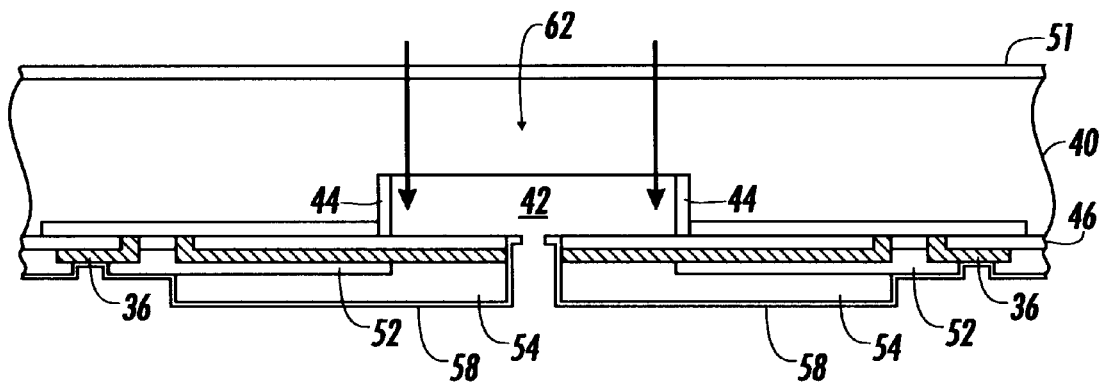
Figure 12:
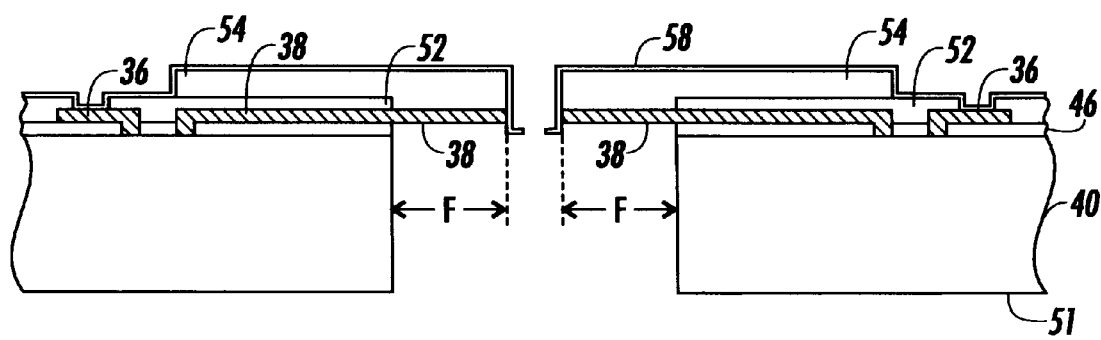

Referring to both FIGS. 11 and 12, subsequently, the silicon oxide layers 46 only in the area shown as F and the complete layer 51 of silicon oxide are removed by placing each chips 32a and 32b in Buffer oxide etchant. Referring to FIG. 12, once the silicon oxide layers 46 and 51 are removed, the interconnects 38, in the area shown as F, will be exposed. The exposed portion of each interconnect 38 is called bonding pad 38. Referring to both FIGS. 12 and 13, next, the titanium-tungsten layer 58 is stripped by placing each chip 32a and 32b in hydrogen peroxide solution.

Figure 13:
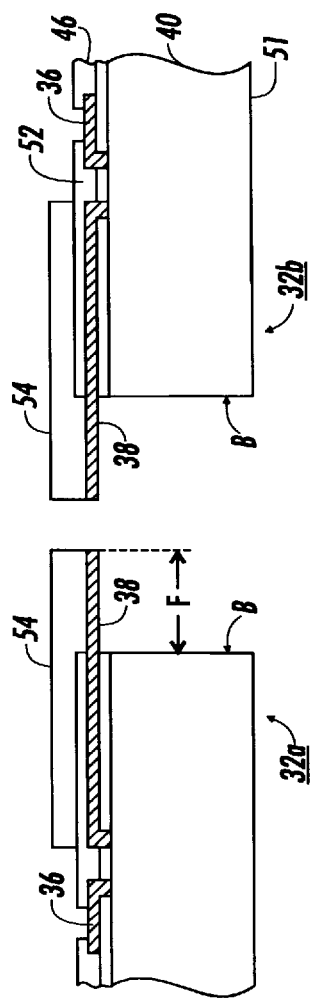

Referring to FIG. 13, after removing the titanium-tungsten layer 58, the remaining layers in the area F are the polyimide layer 54 and the bonding pads 38. Since 50-micron thick polyimide layer 54 and the 1 to 2 micron thick aluminum bonding pads 38 are both fairly soft, the area shown as F is flexible, but rigid enough to maintain its flatness. Therefore, the chips 32a and 32b shown in FIG. 13, have integrated interconnects 38, which extend beyond the boundary B of each chip 32a and 32b and are flexible beyond that boundary.

It should be noted that in this specification, "integrated flexible interconnects" shall mean "flexible interconnects which are fabricated during the fabrication of the integrated circuit as integral parts of the integrated circuit".

It should also be noted that the disclosed embodiment of this invention is an enabler for fabricating interconnects with a pitch less than 15 microns, however, it can also be used for fabricating bonding pads with a pitch more than 15 micron.

In order to connect the flexible interconnects 38 to any external circuit without creating a fanout for the flexible interconnects 38, the external connection means needs to have fine pitch such as the pitch of flexible interconnects 38. It should be noted that external connection means can be a connection cable or the bonding pads of an integrated circuit.

Figure 14:
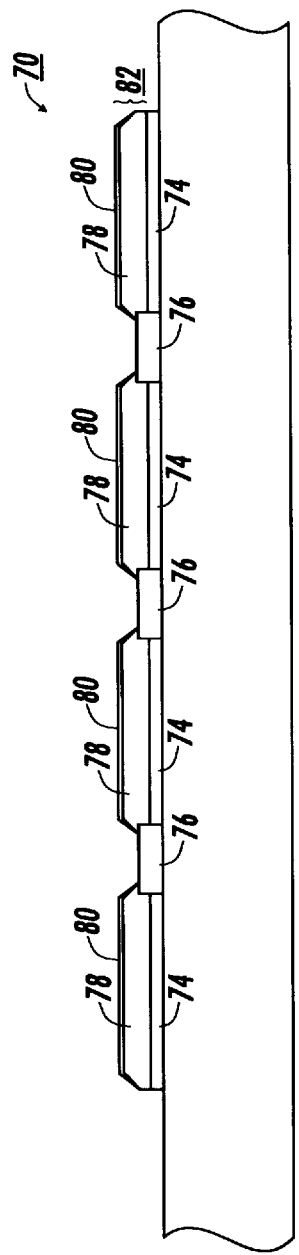
FIG. 14 shows a cross sectional view of a matching chip for the chip of FIG. 13.

Referring to FIG. 14, there is shown a cross sectional view of an external connection means. For the purpose of discussion, in FIG. 14, the connection means are shown as the bonding pads 74 of a matching chip 70.

In FIG. 14, the matching chip 70 has a plurality of bonding pads 74 with a pitch that is the same as the pitch of the flexible bonding pads 38. A layer 76 of silicon oxide insulates the bonding pads 74 from each other. In order to create a connection means, instead of a solder bump, a layer 78 of nickel and a layer 80 of gold are deposited on the bonding pads 74.

A 2-micron layer 78 of nickel is deposited selectively onto the aluminum bonding pads 74 by well-known process of electroless nickel plating. The concept of electroless nickel plating is discussed at length by Kaiser Wong, Kirk Chi and Arnikara Rangappan in their article "Application of Electroless Nickel Plating in the Semiconductor Microcircuit Industry", published in Plating and Surface Finishing Magazine, July 1988.

Subsequently, a 0.5–1 micron layer 80 of gold is placed over the layer of nickel by electroless plating. The gold solution used in this step has a pH level of about 5 to 6 to be safe for aluminum bonding pads 74. Layers 78 and 80 create connection blocks 82. Since both layers 78 and 80 are thin layers, they slightly overplate onto the silicon oxide layer 76.

Referring to FIG. 15, there is shown how the flexible bonding pads 38 of FIG. 13 are connected to the connection blocks 82 of FIG. 14. In FIG. 15, the connection blocks 82 are placed under the flexible bonding pads 38 to form joining bonding pads. Referring to FIG. 16, a clip 84 is placed over the joining bonding pads of FIG. 15. The pressure applied to each joining bonding pads causes each flexible bonding pad 38 to create an electrical connection with the gold layer 80 (FIG. 14) of the respective connection block 82. Therefore, with a proper amount of pressure, a reliable electrical connection between the two chips can be established.

Another method of connecting the flexible interconnects 38 to external circuit is through a well known thermal compression technique which does not require a clip. By applying thermal compression, the gold layer 80 of the connection blocks 82 of the matching chip and the aluminum of the flexible bonding pads 38 will melt and form a one piece connection.

However, in this technique, the bonding pads of the matching chip require a thicker connection block. Typically, depositing more metal on the bonding pads to create a thicker connection block causes substantial overplating onto the area allocated to the adjacent bonding pads. This in turn causes problem in the creation of the connection blocks with higher thickness.

U.S. patent application Ser. No. 09/085,847, "Fine Pitch Flip Chip Interconnection" Attorney Docket No. D/98248 (Common Assignee) and U.S. patent application Ser. No. 09/085,867, "Fine Pitch Flip Chip Interconnection" Attorney Docket No. D/98248Q (Common Assignee) both filed concurrently herewith, disclosure of which are incorporated herein by reference, resolve the problem of overplating of thicker connection blocks. The above applications, disclose a wall structure which is created around the bonding pads to confine the connection blocks to a given area during the fabrication. Once the connection blocks are created, the wall structure will be removed.

Therefore, a matching chip with proper connection blocks can be created by using the wall structure disclosed in the above applications. For a 10-micron pitch, the connection blocks of the matching chip have about 5 micron thick layer of nickel and about 4 micron thick layer of gold. Again by applying thermal compression, the gold layer of the connection blocks of the matching chip and the aluminum of the flexible bonding pads will melt and form a one piece connection.

It should be noted that prior to joining the flexible bonding pads to the matching chip either by a clip or by thermal compression technique, the naturally formed oxide film on the surface of flexible bonding pad is removed by ultra sonic scrubbing.

Figure 17:
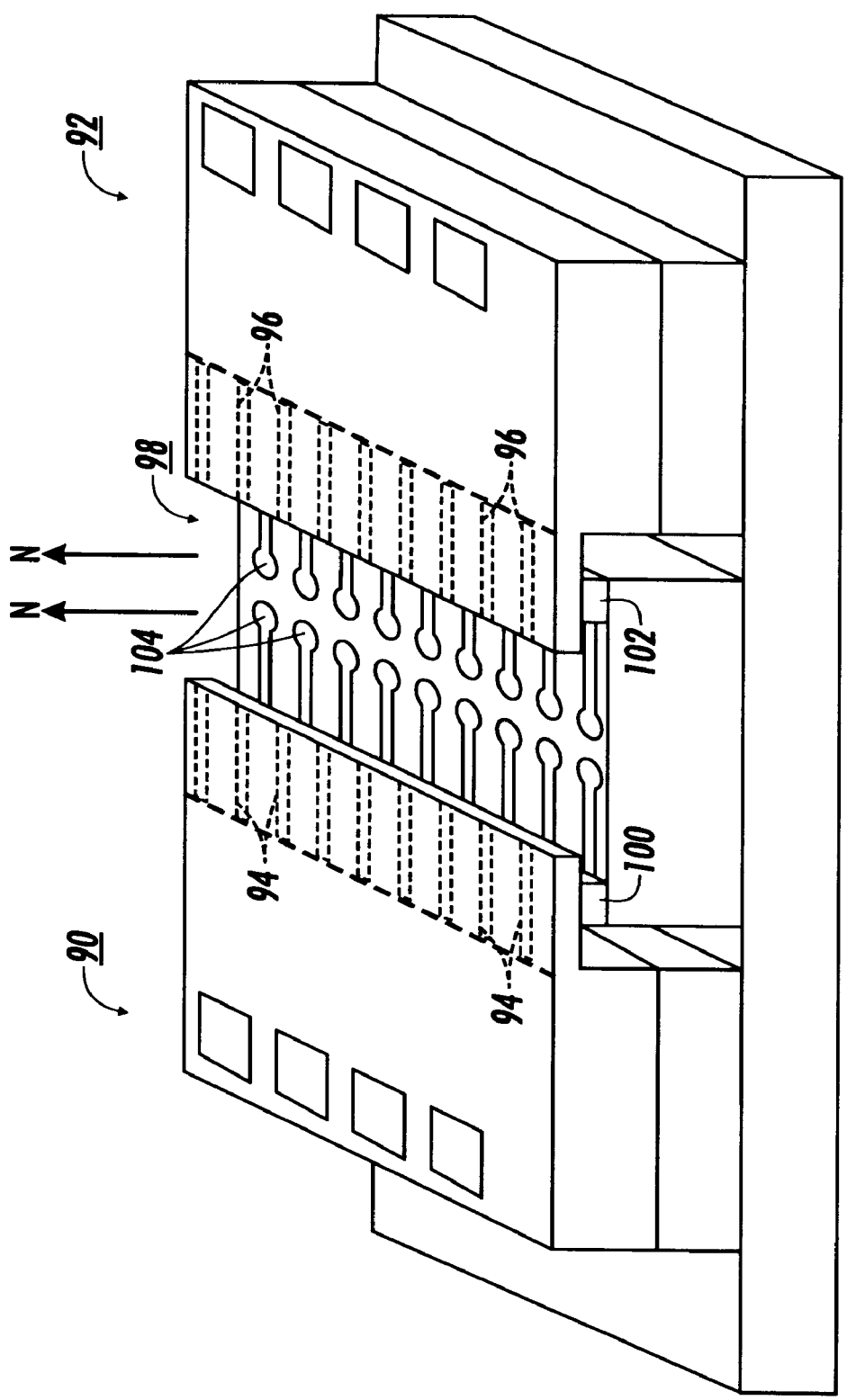
FIG. 17 shows an application of the flexible bonding pads of this invention.

Referring to FIG. 17, there is shown an application of the flexible interconnects of this invention. In FIG. 17, two driver chips 90 and 92 which have flexible bonding pads 94 and 96 respectively are used in a chip to chip bonding with a matching laser diode chip 98. The laser diode chip 98 has a plurality of connection blocks 100 and 102 to contact the flexible bonding pads 94 and 96 respectively. To provide the electrical connection between the three chips 90, 92, and 98, a clip (not shown) will be placed over the bonding pads 94 and the connection blocks 100 and another clip (not shown) will be placed over the bonding pads 96 and the connection blocks 102. In this arrangement, the two chips 90 and 92 provide electrical connection to the laser diode chip 98, which has a plurality of laser diodes 104 to emit plurality of light beams in the direction shown as N.

Alternatively, in FIG. 17, the bonding pads 94 and 96 can be bonded to the connection blocks 100 and 102 by using thermal compression bonding technique without using a clip.

It should be noted that numerous changes in details of construction and the combination and arrangement of elements may be resorted to without departing from the true spirit and scope of the invention as hereinafter claimed.

What is claimed is:

1. A process of creating an integrated circuit with integrated flexible interconnects comprising the steps of:
    a. creating an integrated circuit within a boundary on a substrate;
    b. creating a plurality of flexible integrated interconnects with a pitch less than 25 microns on the integrated circuit in such a manner that the plurality of interconnects to have electrical connection to the integrated circuit extend beyond the boundary of the integrated circuit onto the substrate of the integrated circuit;
    c. creating a support layer over the plurality of integrated interconnects; and
    d. removing the substrate under the plurality of interconnects only in the area beyond the boundary of the integrated circuit.

2. The process recited in claim 1, wherein the support layer in step c is polyimide.

3. The process recited in claim 2, wherein the plurality of integrated interconnects are aluminum.

4. The process of creating an integrated circuit with flexible integrated interconnects comprising the steps of:
    a. creating an integrated circuit within a boundary on a substrate;
    b. creating an insulation layer on the integrated circuit;
    c. creating a plurality of flexible integrated interconnects with a pitch less than 25 microns on the insulation layer in such a manner that the plurality of interconnects to have electrical connection to the integrated circuit and extend beyond the boundary of the integrated circuit onto the substrate of the integrated circuit;
    d. creating a passivation layer over the plurality of integrated interconnects;
    e. Patterning the passivation layer to expose the plurality of integrated interconnects beyond the boundary of the integrated circuit;
    f. creating a support layer over the passivation layer to cover the passivation layer and the exposed plurality of integrated interconnects;
    g. removing the substrate under the plurality of interconnects only in the area beyond the boundary of the integrated circuit; and
    h. removing the insulation layer under the plurality of interconnects only in the area beyond the boundary of the integrated circuit.

5. The process recited in claim 4, wherein the insulation layer in step b is silicon oxide.

6. The process recited in claim 5, wherein the passivation layer in step d is silicon oxide.

7. The process recited in claim 6, wherein the support layer in step f is polyimide.

8. The process recited in claim 7, wherein the plurality of integrated interconnects are aluminum.

9. The process recited in claim 4, wherein the insulation layer in step b is silicon nitrite.

10. The process recited in claim 4, wherein the passivation layer in step d is silicon nitrite.

11. The process recited in claim 10, wherein the support layer in step f is polyimide.

12. The process recited in claim 11, wherein the plurality of integrated interconnects are aluminum.

* * * * *